United States Patent
You

(10) Patent No.: US 9,998,095 B2
(45) Date of Patent: Jun. 12, 2018

(54) SURFACE ACOUSTIC WAVE FILTER HAVING METAL PARTS ON A PASSIVATION PART

(71) Applicant: WISOL CO., LTD., Osan-si, Gyeonggi-do (KR)

(72) Inventor: Dong Jun You, Suwon-si (KR)

(73) Assignee: WISOL CO., LTD., Osan-si, Gyeonggi-Do (KR)

( * ) Notice: Subject to any disclaimer, the term of this patent is extended or adjusted under 35 U.S.C. 154(b) by 124 days.

(21) Appl. No.: 15/086,464

(22) Filed: Mar. 31, 2016

(65) Prior Publication Data

US 2016/0294359 A1 Oct. 6, 2016

(30) Foreign Application Priority Data

Mar. 31, 2015 (KR) .................. 10-2015-0045339

(51) Int. Cl.
*H03H 9/64* (2006.01)
*H03H 9/02* (2006.01)

(52) U.S. Cl.
CPC ...... *H03H 9/6496* (2013.01); *H03H 9/02818* (2013.01); *H03H 9/02937* (2013.01); *H03H 9/02984* (2013.01); *H03H 9/02992* (2013.01)

(58) Field of Classification Search
CPC ........... H03H 9/02818; H03H 9/02858; H03H 9/02881; H03H 9/02937; H03H 9/02984; H03H 9/02992; H03H 9/64; H03H 9/6489; H03H 9/6496
USPC ................................ 333/193–195; 310/313 B
See application file for complete search history.

(56) References Cited

U.S. PATENT DOCUMENTS

| | | | | |
|---|---|---|---|---|
| 5,215,546 A | * | 6/1993 | Cho | H03H 3/08 29/25.01 |
| 7,939,989 B2 | * | 5/2011 | Solal | H03H 9/02858 310/313 B |
| 8,294,331 B2 | * | 10/2012 | Abbott | H03H 9/02858 29/25.35 |
| 2009/0267707 A1 | * | 10/2009 | Miura | H03H 9/1452 333/193 |
| 2013/0051588 A1 | * | 2/2013 | Ruile | H03H 3/08 381/190 |
| 2013/0249647 A1 | * | 9/2013 | Nakanishi | H03H 9/02559 333/186 |

(Continued)

FOREIGN PATENT DOCUMENTS

| | | |
|---|---|---|
| JP | 2012-160840 A | 8/2012 |
| JP | 2013-90228 A | 5/2013 |

(Continued)

*Primary Examiner* — Barbara Summons
(74) *Attorney, Agent, or Firm* — LRK Patent Law Firm

(57) ABSTRACT

A SAW filter includes a substrate, an upper bus bar arranged on the substrate, a lower bus bar arranged on the substrate so as to face the upper bus bar, a first finger IDT arranged so as to be connected to the upper bus bar at one end, a second finger IDT arranged so as to be connected to the lower bus bar at one end, a passivation part formed on the first finger IDT and the second finger IDT, a first metal part formed on the passivation part and including all area of the upper bus bar and a partial area of the first finger IDT, and a second metal part formed on the passivation part and including all area of the lower bus bar and a partial area of the second finger IDT.

11 Claims, 3 Drawing Sheets

(56) References Cited

U.S. PATENT DOCUMENTS

2014/0001919 A1* 1/2014 Komatsu ............ H03H 9/02818
310/313 B

FOREIGN PATENT DOCUMENTS

| JP | 2014-120966 A | 6/2014 |
|----|---------------|--------|
| KR | 10-1996-0016119 A | 5/1996 |
| KR | 10-1999-00072441 A | 9/1999 |
| KR | 10-0653089 A | 11/2006 |

* cited by examiner

SURFACE ACOUSTIC WAVE FILTER HAVING METAL PARTS ON A PASSIVATION PART

CROSS REFERENCE TO RELATED APPLICATION

This application claims the benefit of Korean Patent Application No. 10-2015-0045339, Mar. 31, 2015, which is hereby incorporated by reference in its entirety into this application.

BACKGROUND OF THE INVENTION

1. Field of the Invention

The present invention relates to a SAW filter, in which metal parts are arranged on the IDT electrodes of the SAW filter so as to improve the characteristics of the SAW filter.

2. Background Art

A surface acoustic wave SAW is an acoustic wave propagating along the surface of an elastic substrate, wherein the acoustic wave is generated from an electric signal as a result of a piezoelectric effect and the electric field of the acoustic wave is concentrated on the peripheries of the surface of the substrate and thus can interact with conduction electrons of a semiconductor element, which is immediately placed on the surface. A medium, through which the acoustic wave propagates, is a piezoelectric material, of which an electromechanical coupling coefficient is high and an acoustic wave energy loss is low. A semiconductor material has a high electron mobility, an optimum resistivity and a low DC power element and thus can secure an optimum efficiency. A surface acoustic wave SAW device is to substitute an electric circuit to an electromechanical element by using the interactions between the surface acoustic wave and the conduction electrons.

Such a surface acoustic wave SAW device includes an input electrode and an output electrode, which are made of a metal thin film in the shape of a comb and provided at both sides on the surface of the piezoelectric medium, wherein a high frequency is input and converted into a surface acoustic wave so as to detect propagation properties with the output electrode and recover the surface acoustic wave into an electric signal. There are delay lines, amplifiers, waveform converters, optical beam deflection elements, optical switches and the like as the application examples thereof.

There are inventions, disclosed as prior arts, derived for solving the properties of such a surface acoustic wave element by arranging fingers at uniform intervals. However, the surface acoustic wave element has a problem that ripples are generated, deteriorating the resonance characteristics and resulting in the insertion loss.

SUMMARY OF THE INVENTION

Accordingly, the present invention has been made to solve the above-mentioned problems occurring in the prior arts, and the present invention has an objective to improve the resonance characteristics through the depression of the transverse mode of a SAW filter.

The present invention has another objective to improve the ripple of the resonance characteristics through the depression of the transverse mode of the SAW filter.

The present invention has still another objective to reduce the insertion loss of the SAW filter.

The present invention has a further objective to reduce the processing steps of the SAW filter while improving the characteristics of the SAW filter.

To accomplish the above objectives, according to an aspect of the present invention, there is provided a SAW filter, which may comprise a substrate, an upper bus bar arranged on the substrate, a lower bus bar arranged on the substrate so as to face the upper bus bar, a first finger interdigital transducer (IDT) arranged so as to be connected to the upper bus bar at one end, a second finger IDT arranged so as to be connected to the lower bus bar at one end, a passivation part formed on the first finger IDT and the second finger IDT, a first metal part formed on the passivation part and including all area of the upper bus bar and a partial area of the first finger IDT, and a second metal part formed on the passivation part and including all area of the lower bus bar and a partial area of the second finger IDT.

The first metal part and the second metal part may be made of copper Cu.

The first metal part includes all area of the upper bus bar and may be formed to be larger than the upper bus bar area, and the second metal part includes all area of the lower bus bar and may be formed to be larger than lower bus bar area.

A SAW filter, according to another aspect of the present invention, may comprise a substrate, an upper bus bar arranged on the substrate, a lower bus bar arranged on the substrate so as to face the upper bus bar, a first finger IDT arranged so as to be connected to the upper bus bar at one end, a second finger IDT arranged so as to be connected to the lower bus bar at one end, a passivation part formed on the first finger IDT and the second finger IDT, a first metal part formed on the passivation part and including a partial area of the upper bus bar, a second metal part formed on the passivation part and including a partial area of the first finger IDT from the one end of the first finger IDT, which is connected to the upper bus bar area, and a partial area of the second finger IDT, a third metal part formed on the passivation part and including a partial area of the lower bus bar, and a fourth metal part formed on the passivation part and including a partial area of the second finger IDT from the one end of the second finger IDT, which is connected to the lower bus bar area, and a partial area of the first finger IDT.

The first metal part includes the partial area of the upper bus bar, wherein the first metal part may be formed including the remaining partial area outside the partial area of the upper bus bar at a side of the upper bus bar, which is not connected to the one end of the first finger IDT.

The third metal part includes the partial area of the lower bus bar, wherein the third metal part may be formed including the remaining partial area outside the partial area of the lower bus bar at a side of the lower bus bar, which is not connected to the one end of the second finger IDT.

The first metal part, the second metal part, the third metal part and the fourth metal part may be made of copper Cu.

A SAW filter, according to still another aspect of the present invention, may comprise a substrate, an upper bus bar arranged on the substrate, a lower bus bar arranged on the substrate so as to face the upper bus bar, a first finger IDT arranged so as to be connected to the upper bus bar at one end, a second finger IDT arranged so as to be connected to the lower bus bar at one end, a passivation part formed on the first finger IDT and the second finger IDT, a first metal part formed on the passivation part and including a partial area of the upper bus bar, a second metal part formed on the passivation part and including a partial area of the second finger IDT from the other end of the second finger IDT and a partial area of the first finger IDT, a third metal part formed on the passivation part and including a partial area of the lower bus bar, and a fourth metal part formed on the passivation part and including a partial area of the first finger IDT from the other end of the first finger IDT and a partial area of the second finger IDT.

The first metal part includes the partial area of the upper bus bar, wherein the first metal part may be formed including the remaining partial area outside the partial area of the upper bus bar at a side of the upper bus bar, which is not connected to the one end of the first finger IDT. The third metal part includes the partial area of the lower bus bar, wherein the third metal part may be formed including the remaining partial area outside the partial area of the lower bus bar at a side of the lower bus bar, which is not connected to the one end of the second finger IDT.

The first metal part, the second metal part, the third metal part and the fourth metal part may be made of copper Cu.

According to the present invention, it is possible to improve the resonance characteristics through the depression of the transverse mode of the SAW filter.

According to the present invention, it is possible to improve the ripple of the resonance characteristics through the depression of the transverse mode of the SAW filter.

According to the present invention, it is possible to reduce the insertion loss of the SAW filter.

According to the present invention, it is possible to reduce the processing steps of the SAW filter while improving the characteristics of the SAW filter.

BRIEF DESCRIPTION OF THE INVENTION

DETAILED DESCRIPTION OF THE PREFERRED EMBODIMENT

Figure 1:
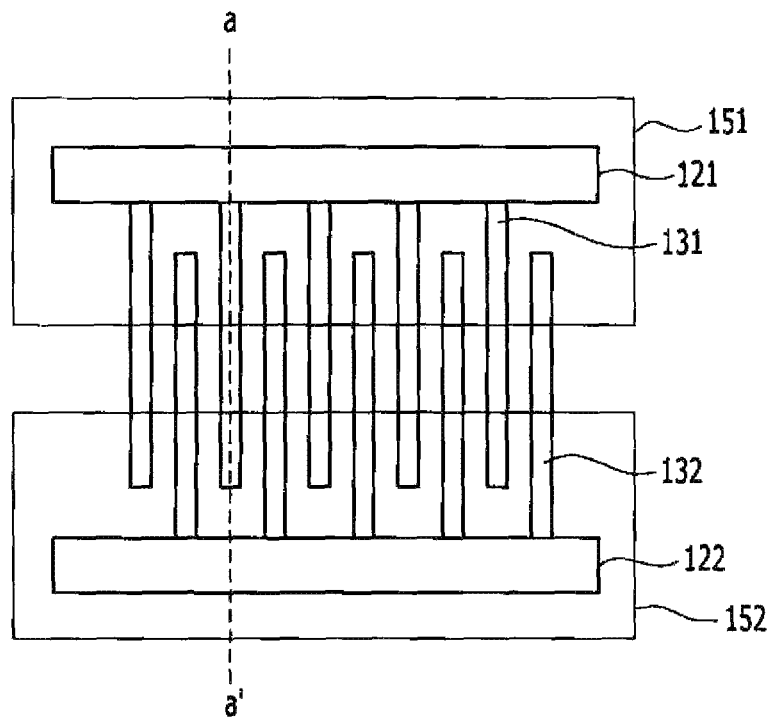
FIG. 1 is a plane view of a SAW filter according to an embodiment of the present invention.

The embodiments described herein are provided to help persons who have average knowledge in the art to readily understand the technical idea of the present invention, but it should be understood that the scope of the present invention is not limited by the example embodiments. In addition, matters illustrated in the attached drawings are schematized in order to easily explain the embodiments of the present invention, and hence, may be different from the actual forms.

The indication, in the embodiments, that each layer (film), areas, patterns or structures are formed "above/on" or "below/under" a substrate, each layer (film), areas, pads or patterns, includes all of such formation made directly or interposing another layer. The criteria with respect to the above/on or below/under each layer are described with reference the drawings. Additionally, it should be also understood that the expression that some component is "connected" to another component means that some component is "directly connected" to another component or is "indirectly connected" to another component through a further component. In addition, it should be also understood that the expression that some part "includes" a component means that some part may be further provided with any other constituent element but not exclude that components unless otherwise noted. In the drawings, the thickness or size of each layer (film), areas, patterns or structures may be deformed for the sake of clarity and convenience of explanation and thus does not entirely reflect the real size thereof.

In the meantime, it should be also understood that the terms of "including" some constituent elements in the specification are "open type" expressions just to say that components exit and do not exclude additional components.

Figure 2:
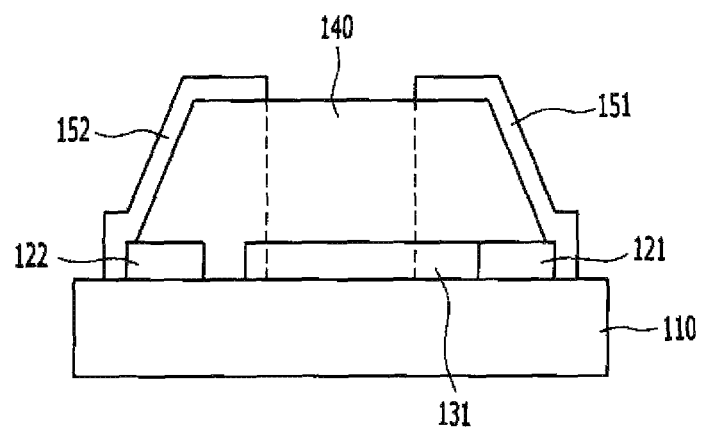
FIG. 2 is a cross-sectional view of the SAW filter according to the embodiment of the present invention.

FIG. 1 is a plane view of a SAW filter according to an embodiment of the present invention, and FIG. 2 is a cross-sectional view of the SAW filter according to the embodiment of the present invention.

Referring to FIG. 1 and FIG. 2, a SAW filter, according to an embodiment of the present invention, comprises a substrate 110, an upper bus bar 121 arranged on the substrate 110, a lower bus bar 122 arranged on the substrate 110 so as to face the upper bus bar 121, and an IDT electrode part, which includes a first finger IDT 131 arranged so as to be connected to the upper bus bar 121 at one end and a second finger IDT 132 arranged so as to be connected to the lower bus bar 122 at one end. Further, the SAW filter comprises a passivation part 140 formed on the IDT electrode part, a first metal part 151, which is formed on the passivation part 140 and includes all area of the upper bus bar 121 and a partial area of the first finger IDT 131, and a second metal part 152, which is formed on the passivation part 140 and includes all area of the lower bus bar 122 and a partial area of the second finger IDT 132.

The SAW filter, according to the embodiment of the present invention, is to depress the parasitic effects of the SAW filter by forming the metal parts 151, 152 on the upper bus bar 121, the lower bus bar 122 and the normal IDT electrode, which includes the first finger IDT 131 and the second finger IDT 132. Similar to the normal IDT electrode part, the SAW filter, according to the embodiment of the present invention, includes the upper bus bar 121, the lower bus bar 122, the first finger IDT 131 and the second finger IDT 132. The first finger IDT 131 has the one end connected to the upper bus bar 121 and the other end arranged at an interval from the lower bus bar 122. The second finger IDT 132 has the one end connected to the lower bus bar 122 and the other end arranged at an interval from the upper bus bar 121. It is also possible to arrange a plurality of first finger IDTs 131 and a plurality of second finger IDTs 132. If a plurality of first and second finger IDTs 131, 132 are arranged, each of the plurality of second finger IDTs 132 is arranged between each of the plurality of first finger IDTs 131.

If the IDT electrode part is arranged on the substrate 110, the passivation part 140 is formed on the IDT electrode part. The passivation part 140 is formed to protect the IDT electrode part. The passivation part 140 is provided with the first metal part 151 and the second metal part 152 thereon. Referring to FIG. 1, the first metal part 151 is formed including all the area of the upper bus bar 121, the partial area of the first finger IDT 131 and a partial area of the second finger IDT 132. The first metal part 151 is formed including the partial area of the first finger IDT 131 from the one end of the first finger IDT 131, which is connected to the upper bus bar 121. Further, the first metal part 151 is formed including the partial area of the second finger IDT 132 from the other end of the second finger IDT 132, which is not connected to the upper bus bar 121.

In addition, the first metal part 151 includes all the area of the upper bus bar 121, wherein the first metal part 151 is formed to be larger than the area of the upper bus bar 121. The second metal part 152 includes all the area of the lower bus bar 122, wherein the second metal part 152 is formed to be larger than the area of the lower bus bar 122. If the first metal part 151 is formed to be larger than the area of the upper bus bar 121 and the second metal part 152 is formed to be larger than the area of the lower bus bar 122, it is possible to improve the resonance characteristics without passing through complicated processing steps.

Figure 3:
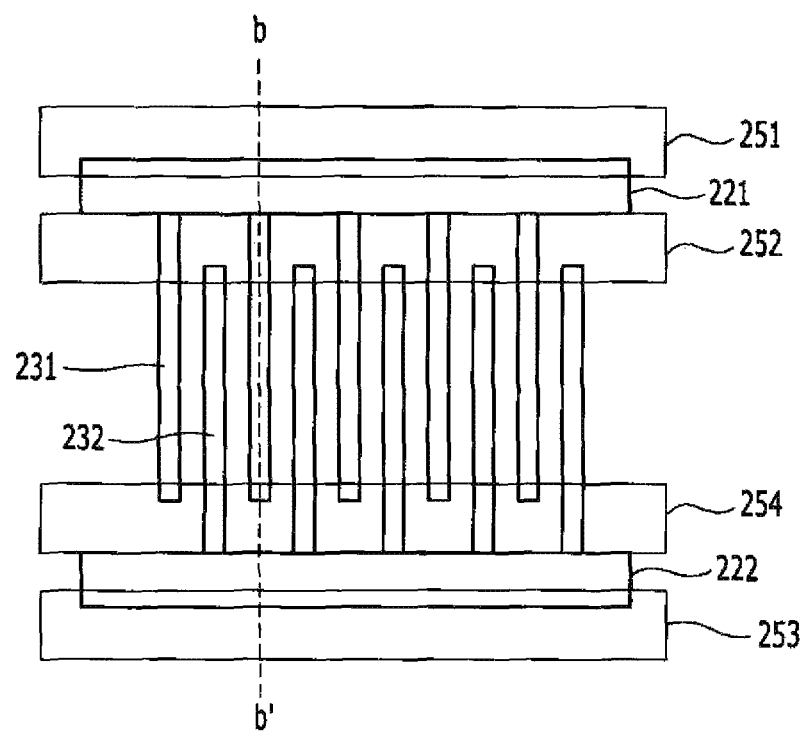
FIG. 3 is a plane view of a SAW filter according to another embodiment of the present invention.
Figure 4:
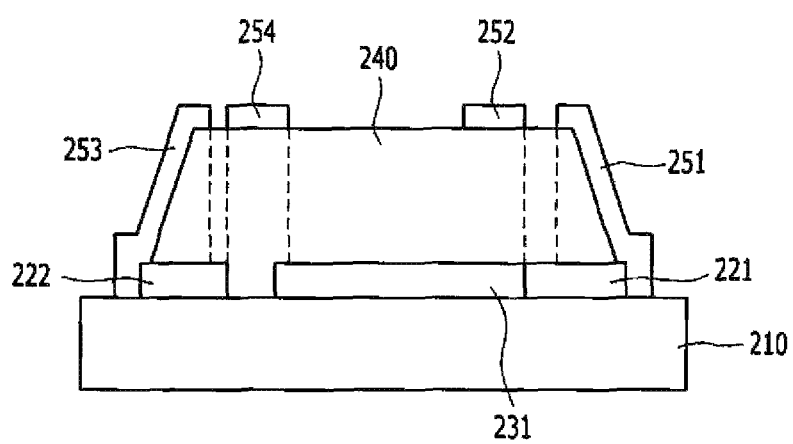
FIG. 4 is a cross-sectional view of the SAW filter according to the embodiment of the present invention.

FIG. 3 is a plane view of a SAW filter according to another embodiment of the present invention, and FIG. 4 is a cross-sectional view of the SAW filter according to the embodiment of the present invention. As shown in FIG. 3 and FIG. 4, the SAW filter, according to another embodiment of the present invention, comprises a substrate 210, an upper bus bar 221 arranged on the substrate 210, a lower bus bar 222 arranged on the substrate 210 so as to face the upper bus bar 221, and an IDT electrode part, which includes a first finger IDT 231 arranged so as to be connected to the upper bus bar 221 at one end and a second finger IDT 232 arranged so as to be connected to the lower bus bar 222 at one end. Further, the SAW filter comprises a passivation part 240 formed on the IDT electrode part, a first metal part 251, which is formed on the passivation part 240 and includes a partial area of the upper bus bar 221 and a partial area of the first finger IDT 231, that is, a partial area of the first finger IDT 231 from one end of the first finger IDT 231, which is connected to the area of the upper bus bar 221. In addition, the SAW filter comprises a second metal part 252, which is formed on the passivation part 240 and includes a partial area of the second finger IDT 232, a third metal part 253, which is formed on the passivation part 240 and includes a partial area of the lower bus bar 222, and a fourth metal part 254, which is formed on the passivation part 240 and includes a partial area of the second finger IDT 232 from the one end of the second finger IDT 232, which is connected to the area of the lower bus bar 222, and a partial area of the first finger IDT 231.

The SAW filter, according to the above embodiment of the present invention, includes the four metal parts 251, 252, 253, 254, which are formed on the passivation part 240. The first metal part 251 is formed including the partial area of the upper bus bar 221. The first metal part 251 includes neither the first finger IDT 231 nor the second finger IDT 232, but includes the partial area of the upper bus bar 221, wherein the first metal part 251 is formed including the remaining partial area outside the partial area of the upper bus bar 221 at a side of the upper bus bar 221, which is not connected to the first finger IDT 231.

The first metal part 251 is formed to have a predetermined area including a partial area except the IDT electrode part.

The second metal part 252 is formed such that the second metal part 252 does not include the area of the upper bus bar 221 but includes a partial area of the first finger IDT 231 and the partial area of the second finger IDT 232. The second metal part 252 is formed including the partial area of the first finger IDT 231 from one end of the first finger IDT 231, which is connected to the area of the upper bus bar 221. The second metal part 252 also includes the partial area of the second finger IDT 232, that is, the partial area of the second finger IDT 232 from the other end of the second finger IDT 232, which is not connected to the area of the upper bus bar 221. The second metal part 252 is formed to have a predetermined area including not only the partial area of the first finger IDT 231 and the partial area of the second finger IDT 232 but also a partial area except the IDT electrode part.

The third metal part 253 includes neither the first finger IDT 231 nor the second finger IDT 232, but is formed including the partial area of the lower bus bar 222, wherein the third metal part 253 is formed including the remaining partial area outside the partial area of the lower bus bar 222 at a side of the lower bus bar 222, which is not connected to the one end of the second finger IDT.

The third metal part 253 is formed to have a predetermined area including the partial area of the lower bus bar 222 and the partial area except the IDT electrode part.

The fourth metal part 254 does not include the area of the lower bus bar 222 and is formed including the partial area of the first finger IDT 231 and the partial area of the second finger IDT 232. The fourth metal part 254 is formed including the partial area of the second finger IDT 232 from the one end of the second finger IDT 232, which is connected to the area of the lower bus bar 222. The fourth metal part 254 also includes the partial area of the first finger IDT 231, that is, the partial area of the first finger IDT 231 from the other end of the first finger IDT 231, which is not connected to the area of the lower bus bar 222. The fourth metal part 244 is formed to have a predetermined area including not only the partial area of the first finger IDT 231 and the partial area of the second finger IDT 232 but also a partial area except the IDT electrode part.

Herein, the first metal part 251, the second metal part 252, the third metal part 253 and the fourth metal part 254 are made of copper Cu.

Figure 5:
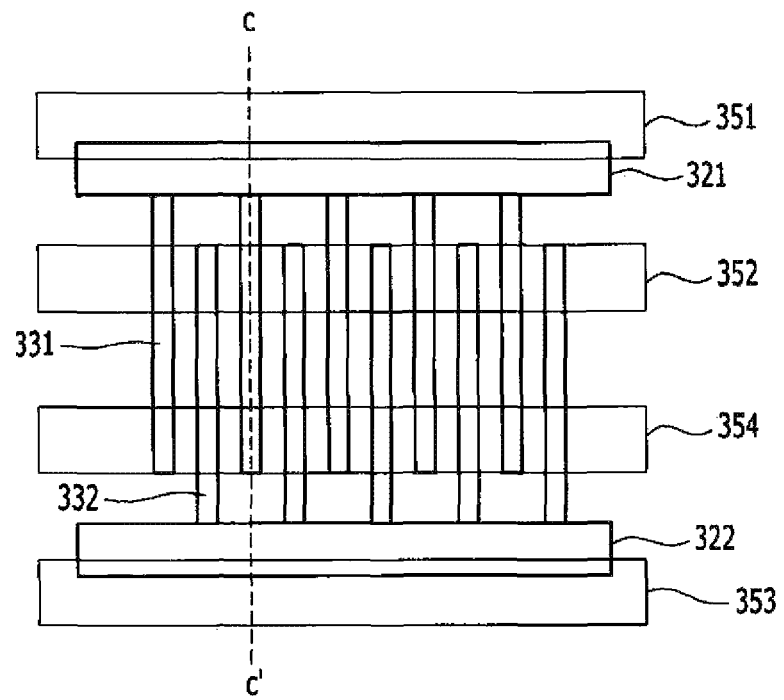
FIG. 5 is a plane view of a SAW filter according to still another embodiment of the present invention.
Figure 6:
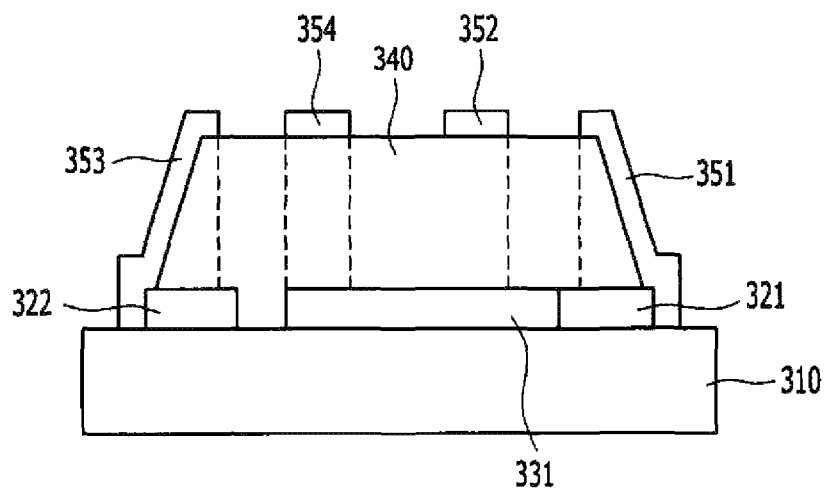
FIG. 6 is a cross-sectional view of the SAW filter according to the embodiment of the present invention.

FIG. 5 is a plane view of a SAW filter according to still another embodiment of the present invention, and FIG. 6 is a cross-sectional view of the SAW filter according to the embodiment of the present invention. Referring to FIG. 5 and FIG. 6, a SAW filter, according to the still another embodiment of the present invention, comprises a substrate 310, an upper bus bar 321 arranged on the substrate 310, a lower bus bar 322 arranged on the substrate 310 so as to face the upper bus bar 321, and an IDT electrode part, which includes a first finger IDT 331 arranged so as to be connected to the upper bus bar 321 at one end and a second finger IDT 332 arranged so as to be connected to the lower bus bar 322 at one end. In addition, the SAW filter comprises a passivation part 340 formed on the IDT electrode part, and a first metal part 351, which is formed on the passivation part 340 and includes a partial area of the upper bus bar 321. Further, the SAW filter comprises a second metal part 352, which is formed on the passivation part 340 and includes a partial area of the second finger IDT 332 from the other end of the second finger IDT 332 in the upper bus bar 321 direction and a partial area of the first finger IDT 331. Further, the SAW filter comprises a third metal part 353, which is formed on the passivation part 340 and includes a partial area of the lower bus bar 322. Further, the SAW filter comprises a fourth metal part 354 formed on the passivation part 340 and including a partial area of the first finger IDT 331 from the other end of the first finger IDT 331 in the lower bus bar 322 direction and a partial area of the second finger IDT 332.

The SAW filter, according to the above embodiment of the present invention, includes the four metal parts 351, 352, 353, 354, which are formed on the passivation part 340. The first metal part 351 is formed including the partial area of the upper bus bar 321. The first metal part 351 includes neither the first finger IDT 331 nor the second finger IDT 332, but includes the partial area of the upper bus bar 321, wherein the first metal part 351 is formed including the remaining partial area outside the partial area of the upper bus bar 321 at a side of the upper bus bar, which is not connected to the one end of the first finger IDT 331.

The first metal part 351 is formed to have a predetermined area including the partial area except the IDT electrode part.

The second metal part 352 does not include the area of the upper bus bar 321, and is formed including the partial area of the first finger IDT 331 and the partial area of the second finger IDT 332. The second metal part 352 is formed including the partial area of the second finger IDT 332 from the other end of the second finger IDT 332, which is connected to the area of the lower bus bar 322. The second metal part 352 is formed to have a predetermined area including not only the partial area of the second finger IDT 332 but also the partial area of the first finger IDT 331 and a partial area except the IDT electrode part.

The third metal part 353 includes neither the first finger IDT 331 nor the second finger IDT 332, and includes the partial area of the lower bus bar 322, that is, the partial area of the lower bus bar 322 in the lower bus bar 322 direction, which is not connected to the second finger IDT 332.

The third metal part 353 is formed to have a predetermined area including the partial area of the lower bus bar 322 and a partial area except the IDT electrode part.

The fourth metal part 354 does not include the area of the lower bus bar 322 and is formed including the partial area of the second finger IDT 332 and the partial area of the first finger IDT 331. The fourth metal part 354 is formed including the partial area of the first finger IDT 331 from the other end of the first finger IDT 331, which is not connected to the area of the upper bus bar 321. The fourth metal part 354 is formed to have a predetermined area including not only the partial area of the first finger IDT 331 but also the partial area of the second finger IDT 332 and a partial area except the IDT electrode part.

Herein, the first metal part 351, the second metal part 352, the third metal part 353 and the fourth metal part 354 are made of copper Cu.

As described above, while the present invention has been particularly shown and described with reference to the example embodiments thereof, it will be understood by those of ordinary skill in the art that the above embodiments of the present invention are all exemplified and various changes, modifications and equivalents may be made therein without changing the essential characteristics and scope of the present invention. Therefore, it would be understood that the present invention is not limited to the forms described in the example embodiments and the technical and protective scope of the present invention shall be defined by the following claims. In addition, it should be also understood that all modifications, changes and equivalences within the technical scope of the present invention defined by the following claims belong to the technical scope of the present invention.

BRIEF EXPLANATION OF REFERENCE SYMBOLS

110, 210, 310: substrate
121, 221, 321: upper bus bar
122, 222, 322: lower bus bar
131, 231, 331: first finger IDT
132, 232, 332: second finger IDT
140, 240, 340: passivation part
151, 251, 351: first metal part
152, 252, 352: second metal part
253, 353: third metal part
254, 354: fourth metal part

What is claimed is:

1. A surface acoustic wave (SAW) filter comprising:
   a substrate;
   an upper bus bar arranged on the substrate;
   a lower bus bar arranged on the substrate so as to face the upper bus bar;
   an interdigital transducer (IDT) electrode part including:
      a first finger IDT arranged so as to be connected to the upper bus bar at one end of the first finger IDT; and
      a second finger IDT arranged so as to be connected to the lower bus bar at one end of the second finger IDT;
   a passivation part formed on the first finger IDT and the second finger IDT;
   a first metal part formed on the passivation part and including all areas of the upper bus bar, a partial area of the first finger IDT, and a partial area of the second finger IDT from another end of the second finger IDT, where the other end of the second finger IDT is not connected to the upper bus bar; and
   a second metal part formed on the passivation part and including all areas of the lower bus bar, a partial area of the second finger IDT, and a partial area of the first finger IDT from another end of the first finger IDT, where the other end of the first finger IDT is not connected to the lower bus bar.

2. The SAW filter according to claim 1, wherein the first metal part and the second metal part are made of copper Cu.

3. The SAW filter according to claim 1, wherein:
   the first metal part includes all the areas of the upper bus bar and is formed to be larger than the upper bus bar area, and
   the second metal part includes all the areas of the lower bus bar and, is formed to be larger than lower bus bar area.

4. A surface acoustic wave (SAW) filter comprising:
   a substrate;
   an upper bus bar arranged on the substrate;
   a lower bus bar arranged on the substrate so as to face the upper bus bar;
   an interdigital transducer (IDT) electrode part including:
      a first finger IDT arranged so as to be connected to the upper bus bar at one end of the first finger IDT; and
      a second finger IDT arranged so as to be connected to the lower bus bar at one end of the second finger IDT;
   a passivation part formed on the first finger IDT and the second finger IDT;
   a first metal part formed on the passivation part and including a partial area of the upper bus bar;
   a second metal part formed on the passivation part and including a partial area of the first finger IDT from the one end of the first finger IDT, which is connected to the upper bus bar area, and a partial area of the second finger IDT;
   a third metal part formed on the passivation part and including a partial area of the lower bus bar; and
   a fourth metal part formed on the passivation part and including a partial area of the second finger IDT from the one end of the second finger IDT, which is connected to the lower bus bar area, and a partial area of the first finger IDT.

5. The SAW filter according to claim 4, wherein the first metal part includes:
   the partial area of the upper bus bar; and
   a remaining partial area outside the partial area of the upper bus bar at a side of the upper bus bar, which is not connected to the one end of the first finger IDT.

6. The SAW filter according to claim 4, wherein the third metal part includes:
the partial area of the lower bus bar; and
a remaining partial area outside the partial area of the lower bus bar at a side of the lower bus bar, which is not connected to the one end of the second finger IDT.

7. The SAW filter according to claim 4, wherein the first metal part, the second metal part, the third metal part and the fourth metal part are made of copper Cu.

8. A surface acoustic wave (SAW) filter comprising:
a substrate;
an upper bus bar arranged on the substrate;
a lower bus bar arranged, on the substrate so as to face the upper bus bar;
an interdigital transducer (IDT) electrode part including:
a first finger IDT arranged so as to be connected to the upper bus bar at one end of the first finger IDT; and
a second finger IDT arranged so as to be connected to the lower bus bar at one end of the second finger IDT;
a passivation part formed on the first finger IDT and the second finger IDT;
a first metal part formed on the passivation part and including a partial area of the upper bus bar;
a second metal part formed on the passivation part and including a partial area of the second finger IDT from the other end of the second finger IDT and a partial area of the first finger IDT;
a third metal part formed on the passivation part and including a partial area of the lower bus bar; and
a fourth metal part formed on the passivation part and including a partial area of the first finger IDT from the other end of the first finger IDT and a partial area of the second finger IDT.

9. The SAW filter according to claim 8, wherein the first metal part includes:
the partial area of the upper bus bar; and
a remaining partial area outside the partial area of the upper bus bar at a side of the upper bus bar, which is not connected to the one end of the first finger IDT.

10. The SAW filter according to claim 8, wherein the third metal part includes:
the partial area of the lower bus bar; and
a remaining partial area outside the partial area of the lower bus bar at a side of the lower bus bar, which is not connected to the one end of the second finger IDT.

11. The SAW filter according to claim 8, wherein the first metal part, the second metal part, the third metal part and the fourth metal part are made of copper Cu.

* * * * *